(12) United States Patent
Sprenger et al.

(10) Patent No.: US 10,730,111 B2
(45) Date of Patent: Aug. 4, 2020

(54) CONTAINER OF REFRACTORY METAL

(71) Applicant: PLANSEE SE, Reutte (AT)

(72) Inventors: Dietmar Sprenger, Waengle (AT); Bernhard Lang, Haeselgehr (AT); Martin Kathrein, Ried im Oberinntal (AT)

(73) Assignee: Plansee SE, Reutte (AT)

( * ) Notice: Subject to any disclaimer, the term of this patent is extended or adjusted under 35 U.S.C. 154(b) by 92 days.

(21) Appl. No.: 15/741,620

(22) PCT Filed: Jun. 16, 2016

(86) PCT No.: PCT/AT2016/000066
§ 371 (c)(1),
(2) Date: Jan. 3, 2018

(87) PCT Pub. No.: WO2017/004630
PCT Pub. Date: Jan. 12, 2017

(65) Prior Publication Data
US 2019/0255619 A1     Aug. 22, 2019

(30) Foreign Application Priority Data

Jul. 3, 2015 (AT) ................................. GM195/2015

(51) Int. Cl.
*B22F 5/00*      (2006.01)
*C23C 4/126*    (2016.01)
(Continued)

(52) U.S. Cl.
CPC .............. *B22F 5/007* (2013.01); *B22D 41/00* (2013.01); *B22F 3/15* (2013.01); *B22F 7/062* (2013.01);
(Continued)

(58) Field of Classification Search
CPC ....................................................... B22F 5/007
See application file for complete search history.

(56) References Cited

U.S. PATENT DOCUMENTS 2,205,940 A * 6/1940 Astrom ................. B22D 41/12
266/276
2,294,044 A * 8/1942 Nielsen ..................... C21B 3/10
266/275
(Continued)

FOREIGN PATENT DOCUMENTS

CN     202530198 U     11/2012
CN     102989856 A      3/2013
(Continued)

OTHER PUBLICATIONS

W. Beitz, et al.; "Taschenbuch fuer den Maschinenbau"; Dubbel; Karl20th Edition; Springer-Verlag, Germany; ISBN 3-540-67777-1 English Abstract.

*Primary Examiner* — Nathaniel Herzfeld
(74) *Attorney, Agent, or Firm* — Laurence A. Greenberg; Werner H. Stemer; Ralph E. Locher

(57) ABSTRACT

A container includes at least two interconnected parts which are connected to one another at least in some regions by a thermally sprayed layer. At least one part is formed of a refractory metal or a refractory metal alloy. The container makes it possible to provide great variety, both with regard to form and dimensions of the container, which is impermeable to ceramic melts even under high operating temperatures. A method for producing a container is also provided.

24 Claims, 4 Drawing Sheets

(51) Int. Cl.
*C23C 4/129* (2016.01)
*C23C 4/134* (2016.01)
*B22F 3/15* (2006.01)
*C23C 4/02* (2006.01)
*C30B 35/00* (2006.01)
*C23C 4/08* (2016.01)
*C23C 24/04* (2006.01)
*B22F 7/06* (2006.01)
*C30B 29/20* (2006.01)
*B22D 41/00* (2006.01)
*C23C 4/18* (2006.01)
*B22F 3/02* (2006.01)
*B22F 3/10* (2006.01)

(52) U.S. Cl.
CPC .......... *C23C 4/02* (2013.01); *C23C 4/08* (2013.01); *C23C 4/126* (2016.01); *C23C 4/129* (2016.01); *C23C 4/134* (2016.01); *C23C 4/18* (2013.01); *C23C 24/04* (2013.01); *C30B 29/20* (2013.01); *C30B 35/002* (2013.01); *B22F 3/02* (2013.01); *B22F 3/10* (2013.01)

(56) References Cited

U.S. PATENT DOCUMENTS

| | | | | |
|---|---|---|---|---|
| 2,472,456 A * | 6/1949 | Anicetti | | B22D 41/08 |
| | | | | 432/265 |
| 4,037,762 A | 7/1977 | Ruckstuhl | | |
| 4,131,265 A * | 12/1978 | McCray | | B22D 41/04 |
| | | | | 266/275 |
| 4,403,955 A * | 9/1983 | Sarno | | F27B 14/08 |
| | | | | 248/311.2 |
| 5,126,102 A * | 6/1992 | Takahashi | | B22F 3/26 |
| | | | | 419/2 |
| 5,249,811 A | 10/1993 | Brueckner et al. | | |
| 5,332,200 A * | 7/1994 | Gorin | | F27B 14/061 |
| | | | | 266/280 |
| 5,482,257 A * | 1/1996 | Holcombe | | F27B 14/10 |
| | | | | 266/275 |
| 5,529,729 A | 6/1996 | Eitel | | |
| 5,988,488 A * | 11/1999 | Slattery | | B23K 35/005 |
| | | | | 228/124.1 |
| 6,132,812 A | 10/2000 | Roedhammer et al. | | |
| 6,399,017 B1 * | 6/2002 | Norville | | B22D 17/007 |
| | | | | 164/312 |
| 8,906,290 B2 | 12/2014 | Klikovich et al. | | |
| 9,803,291 B2 | 10/2017 | Katoh et al. | | |
| 2009/0130619 A1 * | 5/2009 | Okada | | F27B 14/0806 |
| | | | | 432/158 |
| 2011/0243180 A1 * | 10/2011 | Kolberg | | C03B 5/021 |
| | | | | 373/142 |
| 2011/0281227 A1 | 11/2011 | Franz et al. | | |
| 2013/0192302 A1 * | 8/2013 | Philllips | | C30B 28/06 |
| | | | | 65/26 |
| 2014/0038119 A1 * | 2/2014 | Goski | | B29C 39/18 |
| | | | | 432/265 |
| 2014/0174341 A1 * | 6/2014 | Kleinpass | | C30B 11/002 |
| | | | | 117/81 |
| 2015/0128849 A1 | 5/2015 | Januschewsky et al. | | |
| 2015/0184311 A1 | 7/2015 | Turenne et al. | | |

FOREIGN PATENT DOCUMENTS

| | | |
|---|---|---|
| CN | 104583464 A | 4/2015 |
| CN | 104685114 A | 6/2015 |
| DE | 4201748 A1 | 7/1993 |
| DE | 102005018021 A1 | 10/2006 |
| EP | 0471245 A1 | 2/1992 |
| EP | 0874385 A1 | 10/1998 |
| EP | 2657372 A1 | 10/2013 |
| JP | H01249666 A | 10/1989 |
| JP | H0593254 A | 4/1993 |
| JP | H11254152 A | 9/1999 |
| JP | 2014521585 A | 8/2014 |
| WO | 2010054853 A2 | 5/2010 |
| WO | 2010072566 A1 | 7/2010 |

* cited by examiner

CONTAINER OF REFRACTORY METAL

BACKGROUND OF THE INVENTION

Field of the Invention

The invention relates to a container, which comprises at least two parts connected to one another, at least one part consisting of refractory metal or a refractory metal alloy with a refractory metal content >80 wt. % The invention also relates to a method for producing a container, which consists at least in some regions of refractory metal or a refractory metal alloy with a refractory metal content >80 wt. %

In the context of this invention, refractory metals is used as a collective term for materials of the fifth group (vanadium, niobium, tantalum) and sixth group (chromium, molybdenum, tungsten) of the periodic table and rhenium. Among the properties of these materials are that they have outstanding dimensional stability even under high operating temperatures and are chemically resistant to many molten materials. Thus, for example, containers made of these materials are used for the melting of glass, oxide ceramics and metals.

Refractory metals are processed into many different products by smelting-reduction or powder-metallurgical process techniques. However, customary welding methods (for example TIG) can only be used in some cases for producing finished parts. This is due to the embrittlement of the weld seam or the heat-affected zone of the weld seam by small amounts of gases or by grain coarsening together with segregation. Welded containers are described for example in CN 202530198 U or EP 2 657 372 A1. Apart from the great brittleness already mentioned, the corrosion resistance is also reduced, since oxygen segregated at grain boundaries makes it easier for molten materials to penetrate.

Connecting methods that do not lead to gas absorption (for example electron beam fusion) or grain coarsening (for example diffusion welding) are very expensive and/or are very limited in terms of where they can be used with respect to possible geometries. Therefore, containers that are used for the melting of glass, oxide ceramics and metals are only produced on an industrial scale by forming or powder-metallurgical net-shaping methods. These methods however have disadvantages from process engineering or economical aspects. For instance, because of brittleness that is inherent in the material, tungsten and its alloys cannot be formed into large containers. The height-to-diameter ratio is also limited. In the case of containers produced by powder-metallurgical net-shaping methods, mention must also be made of disadvantageous product properties. These methods usually only comprise powder compacting and sintering, whereby the component density is around 85 to 95%. Since the pores tend to lie at grain boundaries, containers produced in this way often have inadequate corrosion resistance to molten materials because the molten material can penetrate to the outside along the grain boundaries that are weakened by the pores.

A coated container is known for example from WO 2010/072566 A1. There, the inner side of a crucible that is produced from a refractory metal is at least partially covered with a protective layer of an oxidic material that does not undergo any phase transformation in a temperature range 20° C. to 1800° C. This represents an additional production step, without thereby solving the problems encountered in crucible production.

SUMMARY OF THE INVENTION

One object of the invention is therefore to provide a container that does not have the disadvantages described above. Specifically, the object of the invention is to provide a container that has excellent corrosion resistance, in particular grain-boundary corrosion resistance to molten ceramic and metallic materials and molten salts.

Another object of the invention is to provide a method that produces impermeable, corrosion-resistant containers inexpensively.

The objects are achieved by the independent claims. Advantageous embodiments are presented in the dependent claims.

A container is used here to refer to a shaped part which has in its interior a hollow space that serves in particular the purpose of separating its contents from its surroundings. The container may be open or closable, for example by means of a cover.

The container in this case comprises at least two parts, which are connected to one another. At least one part consists of refractory metal or a refractory metal alloy, the refractory metal content being >80 wt. % As already mentioned, the term refractory metals is used to refer to materials of the fifth group (vanadium, niobium, tantalum) and sixth group (chromium, molybdenum, tungsten) of the periodic table and rhenium. To be mentioned as further preferred components of the refractory metal alloy are high-melting, ceramic compounds, such as for example oxides, which preferably have a melting point of >2000° C. The oxides of the metals of the group aluminum, titanium, zirconium, hafnium, calcium, magnesium, strontium, yttrium, scandium and rare earth metals can be cited as preferred oxides.

The preferred refractory metal content is preferably >90 wt. %, in particular >95 wt. % To be cited as particularly suitable refractory metals are molybdenum and tungsten. Refractory metals without further alloying constituents or refractory metal alloys in which all of the alloying constituents are chosen from the group of refractory metals also represent a preferred embodiment of the invention. Thus, in particular technically pure molybdenum, technically pure tungsten or molybdenum-tungsten alloys are suitable for melting aluminum oxide (for instance for sapphire single-crystal pulling methods). Technical purity is used here to refer to the metal with customary production-related impurities.

Furthermore, the entire container preferably consists of refractory metal or a refractory metal alloy with a refractory metal content >80 wt. %

The at least two parts are then connected to one another at least in some regions by way of a thermally sprayed layer. A thermally sprayed layer can be clearly identified by a person skilled in the art on the basis of its microstructure. For instance, the sprayed particles are deformed when they impinge on the substrate, creating the "pancake structure" that is typical of thermally sprayed layers.

Thermal spraying methods include melt-bath spraying, electric-arc spraying, plasma spraying, flame spraying, high-velocity oxy-fuel spraying, detonation spraying, cold-gas spraying, laser spraying and PTWA (plasma transferred wire arc) spraying. In the case of plasma spraying, a distinction is again made, depending on the spraying atmosphere, between atmospheric plasma spraying, plasma spraying under a shielding gas and vacuum plasma spraying.

It has surprisingly now been found that the thermally sprayed layer forms an excellent connection with the parts to be connected, making it possible to produce containers that achieve the objects according to the invention. In particular, it is surprising that these containers have excellent impermeability to molten materials, such as for example ceramic molten materials. Even when in use for a long time, the sprayed layer/part connection zone has great resistance to the penetration of molten materials. Another important advantage is that the container according to the invention can take a variety of forms, for example with respect to diameter (in the case of round containers), length/width (in the case of rectangular containers) and height, that cannot be achieved with crucibles according to the prior art.

The sprayed layer/part bonding zone is preferably formed as a metallurgical bond and/or an form-locking connection.

A metallurgical bond is a collective term for all connections in which the parts to be connected are held together by atomic or molecular forces. For example, in the case of plasma spraying, the sprayed droplets are at a temperature that lies above the respective solidus temperature. The substrate is also usually heated. When the sprayed droplets impinge on the substrate, the formation of a metallurgical bond is brought about by diffusion and/or a chemical reaction. A person skilled in the art can clearly distinguish a metallurgical bond from other connecting techniques by a scientific material analysis.

An form-locking connection is understood as meaning a connection that is produced by at least two parts to be joined engaging in one another. If for example the parts to be joined have a roughness, during the thermal spraying the depressions are filled with the sprayed material. This creates a toothing effect, and consequently an form-locking connection. A person skilled in the art can also clearly distinguish an form-locking connection from other connection techniques.

In a particularly preferred way, the connection is formed in a metallurgically bonding or metallurgically bonding and form-locking manner.

Furthermore, the sprayed layer is preferably formed as a seam. The seam is in this case preferably formed by many sprayed layers. Although the connection according to the invention cannot be classified as a welded connection, the definition or description of the form of seam that follows is along the lines of the conventions used in the area of welding technology. Instead of the welding filler, in the case of the present invention the material of the layer forms the seam. The description of the forms of seam can be taken from standard textbooks, such as for example Dubbel, Taschenbuch für den Maschinenbau [pocketbook for mechanical engineering], 20th edition, Springer-Verlag, ISBN 3-540-67777-1, G10.

The sprayed seam is preferably formed as a U, V, Y or I seam. A fillet seam also represents a preferred embodiment. Particularly preferred forms of seam are the U seam and the V seam. The included angle of the V or U seam can be chosen within a wide range, it also being possible to choose angles that go beyond the usual range of weld seams. A preferred range is 45° to 230°. Such large angles cannot be achieved by customary welding methods. In the case of an angle >180°, the V includes the region of the parts to be connected. In the case of relatively great thicknesses of the parts to be connected, a double-V seam (X seam) or a double-U seam may also be particularly advantageous. In the case of a parallel joint, fillet seams are suitable for securely connecting two or more parts.

Apart from in the form of a seam, other embodiments are also possible and advantageous, such as for example a connection by a sprayed layer applied over a surface area.

In an advantageous way, the parts to be connected are fixed in relation to one another or connected to one another before the sprayed layer is applied by an form-locking connection. For this purpose, the parts are formed at least in some regions in such a way that an form-locking connection is made possible. To be mentioned as particularly advantageous form-locking connections are the tongue-and-groove and the feather-key connection and also pinning.

It is however also possible and advantageous to fix the parts to be connected in relation to one another or to connect them to one another before the sprayed layer is applied by a force-locking connection. Advantageous force-locking connections are pressure, shrinkage and spline connections.

By caulking, both an form-locking and a force-locking connection is achieved. Fixing the parts to be connected in relation to one another or connecting them to one another by caulking represents a preferred embodiment of the invention.

It is also advantageous to fix the parts to be connected in relation to one another or to connect them to one another before the sprayed layer is applied by a local metallurgical bond, for example by spot welding.

As already mentioned, the refractory metal is advantageously molybdenum or tungsten. Advantageous molybdenum or tungsten alloys are Mo—W alloys in the entire concentration range and also molybdenum- or tungsten-based alloys with a molybdenum or tungsten content of >80 wt. %, advantageously >90 wt. %, in particular advantageously >95 wt. %, the remainder advantageously being a high-melting oxide. The oxide is in this case advantageously in a finely distributed form in the base material.

Particularly advantageous materials are compiled in the following list:

Mo (purity >99.5 wt. %)
W (purity >99.5 wt. %)
Mo—W alloy with 0.5 wt. %<W<99.5 wt. %
Mo-0.01 to 20 wt. % at least of an oxide selected from the group consisting of $HfO_2$, $ZrO_2$, $TiO_2$, $Al_2O_3$, $Y_2O_3$, $Sc_2O_3$, rare earth metal oxide, SrO, CaO and MgO.
Mo-0.01 to 20 wt. % mixed oxide, which consists at least in respect of 50 mol % of an oxide selected from the group consisting of $HfO_2$, $ZrO_2$, $TiO_2$, $Al_2O_3$, $Y_2O_3$, $Sc_2O_3$, rare earth metal oxide, SrO, CaO and MgO.
W-0.01 to 20 wt. % at least of an oxide selected from the group consisting of $HfO_2$, $ZrO_2$, $TiO_2$, $Al_2O_3$, $Y_2O_3$, $Sc_2O_3$, rare earth metal oxide, SrO, CaO and MgO.
W-0.01 to 20 wt. % mixed oxide, which consists at least in respect of 50 mol % of an oxide selected from the group consisting of $HfO_2$, $ZrO_2$, $TiO_2$, $Al_2O_3$, $Y_2O_3$, $Sc_2O_3$, rare earth metal oxide, SrO, CaO and MgO.
Mo—W alloy (0.5 wt. %<W<99.5 wt. %)–0.01 to 20 wt. % at least of an oxide selected from the group consisting of $HfO_2$, $ZrO_2$, $TiO_2$, $Al_2O_3$, $Y_2O_3$, $Sc_2O_3$, rare earth metal oxide, SrO, CaO and MgO.
Mo—Ta alloy with 0.1 wt. %<Ta<99 wt. %
Mo—Nb alloy with 0.1 wt. %<Nb<99 wt. %
Mo—Cr alloy with 0.1 wt. %<Cr<99 wt. %
Mo—Re alloy with 0.1 wt. %<Re<50 wt. %
W—Ta alloy with 0.1 wt. %<Ta<99 wt. %
W—Nb alloy with 0.1 wt. %<Nb<99 wt. %
W—Cr alloy with 0.1 wt. %<Cr<99 wt. %
W—Re alloy with 0.1 wt. %<Re<26 wt. %
Nb (purity >99.5 wt. %)
Ta (purity >99.5 wt. %)
V (purity >99.5 wt. %)
Re (purity >99.5 wt. %)
Cr (purity >99.5 wt. %)

It is also advantageous if the sprayed layer is formed by plasma spraying. In the case of plasma spraying, the coating substance is melted by the high temperature of the plasma. The plasma jet entrains the particles and accelerates them onto the parts to be connected. It is ensured by the high temperature of the particles when they impinge on the parts to be connected that a metallurgical bond reliably forms between the sprayed layer and the parts to be connected. In an advantageous way, the parts to be connected are heated to a temperature >500° C., preferably >1000° C., in particular preferably >1500° C. before the sprayed layer is applied. The advantageous range is limited in the upward direction by the melting point of the parts to be connected. The plasma spraying is preferably performed in a shielding gas atmosphere (for example argon) or in a vacuum. The latter embodiment is a particularly advantageous refinement of the invention, since it is ensured by a coating process in a vacuum that no oxide layer or oxide regions that has/have adverse effects both on the strength of the connection and on the grain-boundary corrosion resistance can form in the region of the sprayed layer/part interface.

Preferred materials for the sprayed layer can be taken from the following table.

---

Mo (purity >99.5 wt. %)
W (purity >99.5 wt. %)
Mo—W alloy with 0.5 wt. % < W < 99.5 wt. %
Mo-0.01 to 20 wt. % at least of an oxide selected from the group consisting of $HfO_2$, $ZrO_2$, $TiO_2$, $Al_2O_3$, $Y_2O_3$, $Sc_2O_3$, rare earth metal oxide, SrO, CaO and MgO.
Mo-0.01 to 20 wt. % mixed oxide, which consists at least in respect of 50 mol % of an oxide selected from the group consisting of $HfO_2$, $ZrO_2$, $TiO_2$, $Al_2O_3$, $Y_2O_3$, $Sc_2O_3$, rare earth metal oxide, SrO, CaO and MgO.
W-0.01 to 20 wt. % at least of an oxide selected from the group consisting of $HfO_2$, $ZrO_2$, $TiO_2$, $Al_2O_3$, $Y_2O_3$, $Sc_2O_3$, rare earth metal oxide, SrO, CaO and MgO.
W-0.01 to 20 wt. % mixed oxide, which consists at least in respect of 50 mol % of an oxide selected from the group consisting of $HfO_2$, $ZrO_2$, $TiO_2$, $Al_2O_3$, $Y_2O_3$, $Sc_2O_3$, rare earth metal oxide, SrO, CaO and MgO.
Mo—W alloy (0.5 wt. % < Mo < 99.5 wt. %) - 0.01 to 20 wt. % at least of an oxide selected from the group consisting of $HfO_2$, $ZrO_2$, $TiO_2$, $Al_2O_3$, $Y_2O_3$, $Sc_2O_3$, rare earth metal oxide, SrO, CaO and MgO.
Mo—Ta alloy with 0.1 wt. % < Ta < 99 wt. %
Mo—Nb alloy with 0.1 wt. % < Nb < 99 wt. %
Mo—Cr alloy with 0.1 wt. % < Cr < 99 wt. %
Mo—Re alloy with 0.1 wt. % < Re < 50 wt. %
W—Ta alloy with 0.1 wt. % < Ta < 99 wt. %
W—Nb alloy with 0.1 wt. % < Nb < 99 wt. %
W—Cr alloy with 0.1 wt. % < Cr < 99 wt. %
W—Re alloy with 0.1 wt. % < Re < 26 wt. %
Nb (purity >99.5 wt. %)
Ta (purity >99.5 wt. %)
V (purity >99.5 wt. %)
Re (purity >99.5 wt. %)
Cr (purity >99.5 wt. %)

---

A further preferred refinement of the invention is obtained if both the sprayed layer and the parts to be connected are formed from refractory metal or a refractory metal alloy. It is particularly advantageous if the sprayed layer and the parts to be connected consist of the same material or, in the case of an alloy, at least have the same base material.

Furthermore, the container is advantageously formed as a round container, for example as a crucible. In an advantageous way, the round container is in this case formed by at least two parts, which are formed as hollow cylinder segments, and at least one bottom part.

It is however also possible and advantageous to design the containers as rectangular containers. The rectangular container is preferably formed by at least two side parts and at least one U-shaped or plate-shaped bottom part. According to the prior art, rectangular containers can only be produced by net-shape pressing/sintering methods. It is not possible for relatively large rectangular containers to be produced by forming processes, for example by deep drawing. It is consequently possible by the present invention also to produce rectangular containers with very great impermeability. Also with respect to the dimensions of a crucible, there are no limits within a wide range. Thus, for example, very large-format crucibles can be produced.

The great impermeability of the container is preferably achieved by the parts to be connected (for example hollow cylinder and bottom part) being produced from deformed material. It is thus possible for example to produce a hollow cylinder segment by pressing, sintering, rolling and bending. The bottom part may likewise be produced from a rolled plate. The parts to be connected can be easily and inexpensively worked by customary methods.

In an advantageous way, the sprayed layer of the container is impermeable to a ceramic molten material (for example $Al_2O_3$). Material degradations, such as for example grain boundary impurities, pores at grain boundaries and grain boundary cracks, can greatly reduce the impermeability of a melt container. It is therefore very surprising for a person skilled in the art that a sprayed layer, which usually likewise has material defects, is impermeable to an $Al_2O_3$ melt even over very long times. Unlike in the case of pressed and sintered parts (pores are mainly at the grain boundaries), pores in the sprayed layer, which in large part are in an isolated form, influence the impermeability to a lesser extent.

The sprayed layer can advantageously not only serve as a connecting element between the parts but also, when applied in a form that extends over a surface area, improve the impermeability of the parts. This is advantageous in particular in the case of only pressed/sintered parts. The sprayed layer can in this case be applied in an easy way before the connecting process. It is in this way easily possible to produce containers that are at least partially provided with a thermally sprayed layer on the inside and/or outside.

The relative density (measured density with respect to theoretical density) of the sprayed layer in the region of the connecting zone and/or of the sprayed layer applied over a surface area is preferably >95%. Excellent results can be achieved if the relative density is >98%, in particular advantageously >99%.

With the container according to the invention it is possible to produce sapphire single crystals by customary methods of production in a dependable process (Kyropoulos, HEM, EFG, CHES, Bagdasarov or Czochralski process). This ensures both a longer service life of the melt container and a greater dependability of the process. Moreover, partial destruction of the single-crystal growing installation, such as may be the case in the event of ceramic melt escaping, is avoided.

The objects in the present case are also achieved by a method for producing a container. The container in this case consists at least in some regions of refractory metal or a refractory metal alloy, the refractory metal content being >80 wt. %

The process in this case comprises at least the following steps:
producing at least two parts,
applying a thermally sprayed layer at least in some regions, so that the sprayed layer at least in some regions forms between at least two parts at least one connection selected from the group consisting of a metallurgical bond and an form-locking engagement.

The production of the parts is advantageously performed by customary powder-metallurgical and/or forming methods. Thus, for example, the parts may be produced by pressing, sintering and subsequent forming, for example rolling. Further forming steps advantageously include bending or stamping. Production by hot isostatic pressing (HIP), optionally followed by a forming process, also represents a preferred method.

The application of the thermally sprayed layer is preferably performed by melt-bath spraying, electric-arc spraying, plasma spraying, flame spraying, high-velocity oxy-fuel spraying, detonation spraying, cold-gas spraying, laser spraying or PTWA (plasma transferred wire arc) spraying. With these spraying methods it is ensured that, when the coating substance impinges, its temperature and/or energy is so high that a metallurgical bond and/or form-locking connection reliably forms. The form-locking connection preferably forms as a result of the already described toothing effect. This toothing effect can be further intensified if the connecting zone is designed appropriately. One easy possible way of doing this is to produce grooves by appropriate machining.

In the case of cold-gas spraying (likewise considered to be included among the thermal spraying methods), the metallurgical bond can only be formed weakly (by microwelding). Since however the rate of impingement of the particles in cold-gas spraying is typically in the range of 400 to 1200 m/s or above, particles of the coating substance penetrate into the material of the substrate (=part to be connected), whereby here too an form-locking connection is reliably formed, even without additional prior machining.

In an advantageous way, the container has at least one of the following properties:
 the sprayed layer is formed as a seam.
 The seam has a U, V, Y or I form or is formed as a fillet seam.
 The parts to be connected are formed at least in some regions in such a way that they are fixed in relation to one another or connected to one another by form-locking engagement or a metallurgical bond.
 The refractory metal is molybdenum or tungsten.
 The sprayed layer is formed by plasma spraying.
 The sprayed layer and the connecting parts consist of refractory metal or a refractory metal alloy.
 The container is formed as a round container.
 The round container is formed by at least two parts, which are formed as hollow cylinder segments, and at least one bottom part.
 The container is formed as a rectangular container.
 The rectangular container is formed by at least two side parts and at least one U-shaped or plate-shaped bottom part.
 The sprayed layer is impermeable to a ceramic melt.

In an advantageous way, the parts to be connected are machined before the sprayed layer is applied in such a way that they can at least in some regions be fixed in relation to one another or connected to one another in an form-locking, force-locking and/or metallurgically bonding manner. Tongue-and-groove, pin, pressure and shrinkage connections represent particularly advantageous connections here.

Furthermore, the parts are advantageously preferably machined in such a way that the connection of the parts by a thermally sprayed seam is possible.

Plasma spraying, and here in turn vacuum plasma spraying, may be mentioned as a particularly advantageous thermal spraying method. In the case of vacuum plasma spraying, the material for the sprayed layer is advantageously introduced radially as powder into a plasma jet produced by a DC arc discharge and melted in the plasma jet and the melted droplets are deposited on a base body. Since the process is carried out under negative pressure, oxidation of the coating material is avoided. A particularly advantageous method here is inductive vacuum plasma spraying (IVPS). A major difference from conventional plasma spraying is that the plasma is produced by inductive heating, whereby the spraying powder can be introduced axially in an easy way already before the formation of the plasma jet. As a result, and by virtue of the lower rate of expansion of the plasma as a consequence of the inductive heating, the powder particles stay in the plasma jet for much longer. Consequently, the energy transfer from the plasma to the individual particles of the spraying powder improves, so that even relatively large particles are completely heated beyond their melting temperature and can be deposited as fully melted droplets. It is in this way possible to use less expensive spraying powder, with a wider particle size distribution, without even any adverse effect on the quality of the layer. In comparison with conventionally produced plasma-sprayed layers, the microstructure that is obtained when using inductive plasma spraying has still further improved impermeability (relative density preferably >98%) to even very low-viscosity ceramic melts. The low relative velocity with which the plasma jet passes over the surface to be coated also proves to be advantageous. The comparatively greater diameter of the jet also has favorable effects on the coating process.

A further improvement of the metallurgical bond can be achieved if the parts to be connected are preheated by the plasma jet, for example to a temperature greater than 700° C. (for example 700 to 2000° C.).

If a method that leads to a connecting zone with a low density is used, the connecting zone can be sealed by the action of a slurry, optionally followed by an annealing. The powder particles of the slurry in this case advantageously likewise consist of a refractory metal or a refractory metal alloy, the average particle size (measured by means of laser diffraction) advantageously being <1 μm. In a particularly advantageous way, the containers according to the invention are suitable for melting aluminum oxide by customary methods, such as for example the Kyropoulos, HEM, EFG, CHES, Bagdasarov or Czochralski process.

The invention is described by way of example below. FIGS. 1 to 17 present embodiments according to the invention.

DESCRIPTION OF THE INVENTION

Example 1

Figure 3:
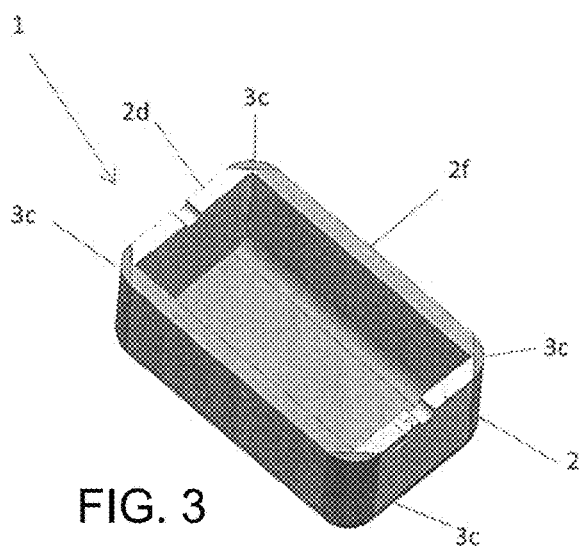
FIG. 3 schematically shows a rectangular container in the state in which it has been joined by metallurgical bonding.

For the production of a Mo rectangular container (1) according to FIG. 3, the following parts (2d,e,f) were used:
Part (2f), which forms the bottom and side surfaces lengthwise: U-shaped forged Mo plate, worked and ground on all sides, wall thickness 9.5 mm
Parts (2d,e), which form the side surfaces widthwise: rolled Mo plates, worked and ground on all sides, wall thickness 9.5 mm
All the parts (2d,e,f) were provided on the surfaces to be connected with a 45° bevel by means of milling. Form-locking fixing was achieved by producing a further bevel (joining gap with 1 mm, 45° on the end faces and also by way of mechanical clamping with an external holding means (at the same time holding means for the coating process) with screw connections.

The metallurgical bonding of the parts (2d,e,f) was performed in each case by way of a thermally sprayed layer (3c), which was produced by IVPS. For this purpose, the clamped parts were mounted in a holding means in a spraying chamber capable of maintaining a vacuum. A commercially available Mo plasma spraying powder was used for the spraying process.

Figure 5:
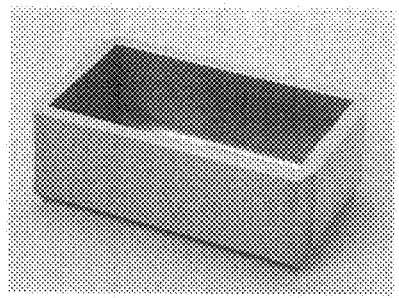
FIG. 5 shows a photo of a rectangular container joined by metallurgical bonding that has been produced completely from Mo (the designation Mo is used in the examples for Mo of technical purity).

The IVPS spraying process was carried out with parameters customary for refractory metals (see for example EP 0 874 385 A1). After the spraying process, the rectangular container (1) was removed from the vacuum chamber and the end faces were worked by means of machining (milling, grinding). A photo of the rectangular container (1) is reproduced in FIG. 5.

Figure 15:
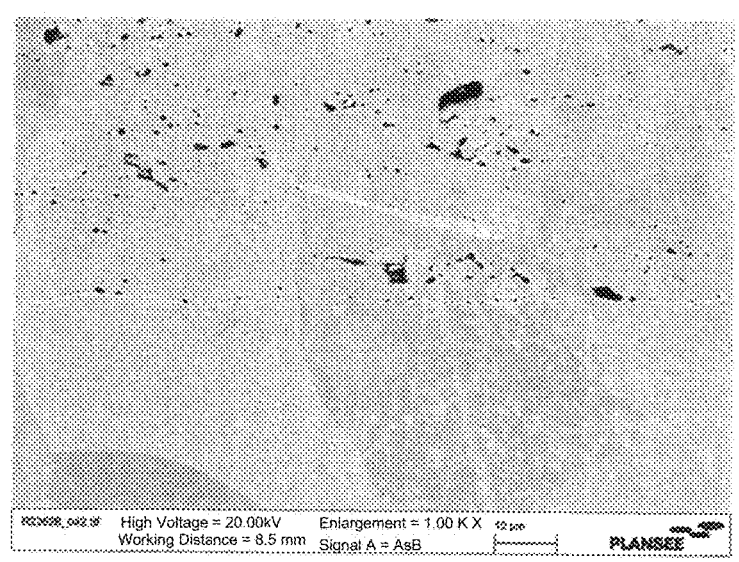
FIG. 15 shows a scanning electron micrograph of the Mo part-Mo sprayed layer joining zone.

Thereafter, aluminum oxide was melted in this rectangular container (1) under a shielding gas (Ar). While in the case of producing sapphire single crystals, the customary temperature of the melt is about 2150° C., the melting process was carried out at 2300° C. in order to simulate intensified conditions. The time for the test was 24 h. After that, the rectangular container (1) was metalographically examined. No penetration of aluminum oxide could be found in the region of the metallurgical bond (see FIG. 15).

Example 2

Figure 1:
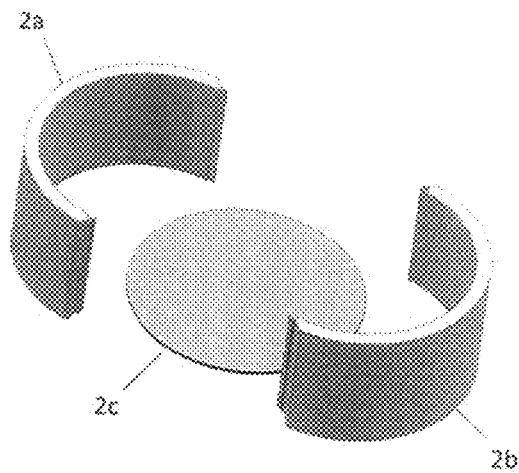
FIG. 1 schematically shows in an exploded representation the parts of a round container before the joining process.
Figure 2:
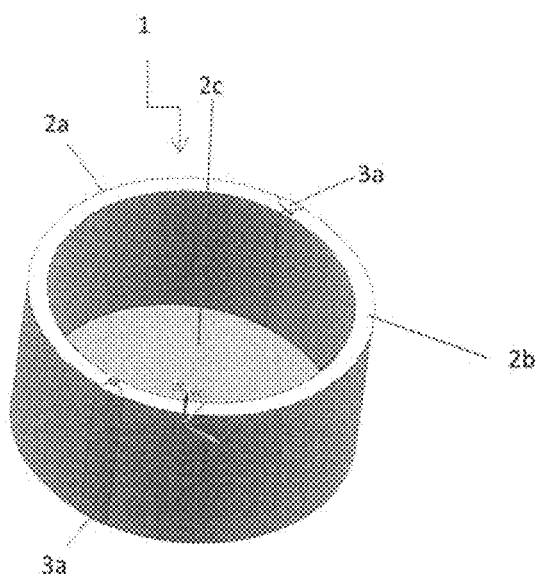
FIG. 2 schematically shows a round container, constructed from the parts according to FIG. 1, in the state in which they have been joined by metallurgical bonding.
Figure 9:
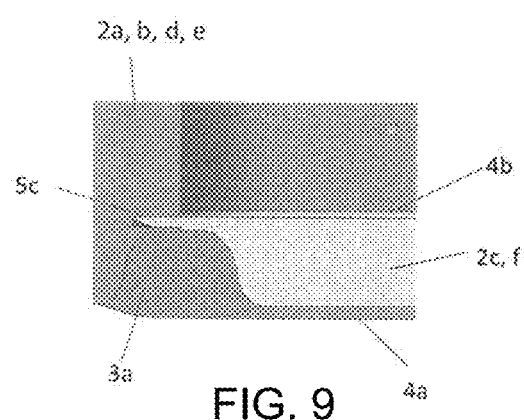
FIG. 9 schematically shows two parts fixed in relation to one another in an form-locking and force-locking manner by caulking and connected in a metallurgically bonding manner by a U seam, and also a sprayed layer for sealing the inside and a sprayed layer for sealing the outside.
Figure 14:
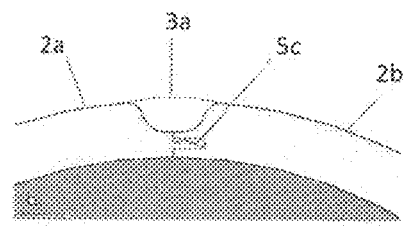
FIG. 14 schematically shows two parts fixed in relation to one another in an form-locking and force-locking manner by caulking and connected in a metallurgically bonding manner by a U seam.
Figure 16:
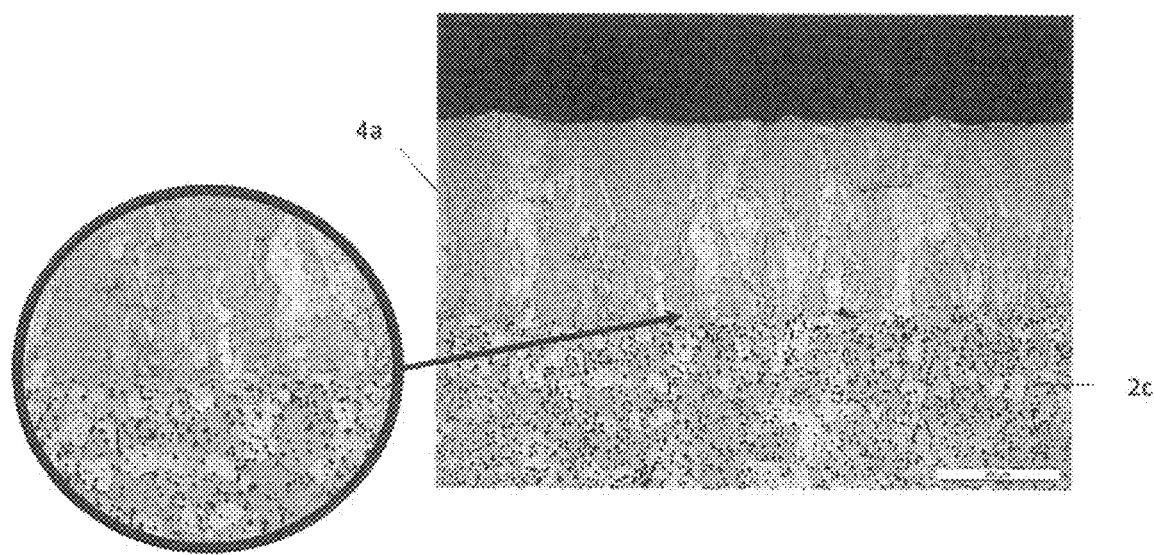
FIG. 16 shows an optical micrograph of a sprayed (IVPS) W layer (relative density 99%), which has been applied on a pressed/sintered W part (relative density 95%).

For the production of a W round container (1) according to FIG. 2, the following parts (2a,b,c) were used (see FIG. 1):
Two hollow cylinder segments (2a,b): the hollow cylinder segments (2a,b) were produced from W sintered plates that were milled on one side to a thickness of 20 mm. The plates were formed into half shells (2a,b). By means of contour milling, the parts (2a,b) were provided at the joints to be connected with a profile (5c) in a way corresponding to FIG. 14 (connection between (2a) and (2b)) or FIG. 9 (connection of (2a,2b) to (2c)) and with a recess for a U seam (3a).
Bottom plate (2c): the bottom plate (2c) was produced from a sintered round W blank with a wall thickness of 20 mm. The blank (2c) was provided on one side (bottom inner side of the finished container (1)) with a W layer (4b) by means of IVPS. The layer thickness was about 300 µm. A commercially available W plasma spraying powder was used for the spraying process. The IVPS spraying process was carried out with parameters customary for refractory metals (see for example EP 0 874 385 A1). By means of contour milling, the bottom plate (2c) was provided at the joints to be connected with a profile (5c) and with a recess for a U seam (3a) in a way corresponding to FIG. 9.
The parts (2a,b,c) were subsequently fixed in relation to one another and connected to one another in an form-locking and force-locking manner by caulking in the region (5b) (see FIGS. 9 and 14). The metallurgical bonding of the parts (2a,b,c) was performed by way of a thermally sprayed U seam (3a) of W, which was produced by IVPS. For this purpose, the clamped parts were mounted in a holding means in a spraying chamber capable of maintaining a vacuum. A commercially available W plasma spraying powder was in turn used for the spraying process. The IVPS spraying process was carried out with parameters customary for refractory metals (see for example EP 0 874 385 A1). After the spraying process, the round container (1) was removed from the vacuum chamber and the end faces were worked by means of machining (milling, grinding). The outside of the bottom was likewise provided with a W layer (4a) about 300 µm thick. Thereafter, aluminum oxide according to Example 1 was melted in this round container (1). The metallographic examination showed no penetration of aluminum oxide in the region of the metallurgical bond. FIG. 16 shows that the W layer (4a) has fewer pores than the W sintered plate (2c).

Example 3

Figure 4:
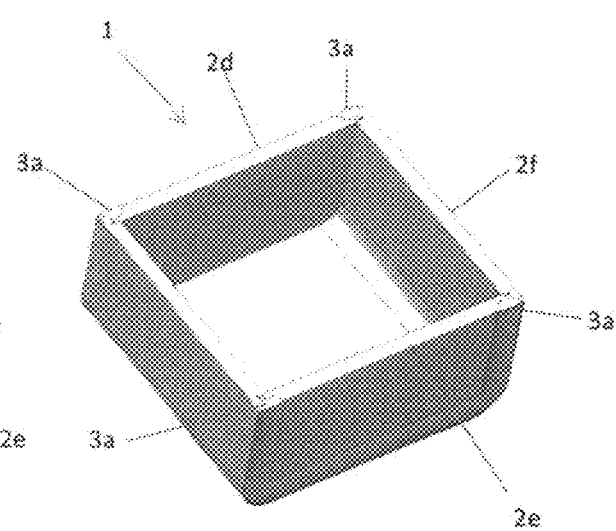
FIG. 4 schematically shows a rectangular container in the state in which it has been joined by metallurgical bonding.

A rectangular container (1) was produced from Mo-1 wt. % $ZrO_2$ according to FIG. 4. The following parts (2d,e,f) were used for the production:

Part (2f) which forms the bottom and side surfaces lengthwise: This part (2f) was produce from a U-shaped forged Mo-1 wt. % ZrO₂ plate, worked and ground on all sides. By means of contour milling, the part (2f) was provided at the joints to be connected with a profile (5c) and with a recess for a U seam (3a) in a way corresponding to FIG. 9.

Parts (2d,e), which form the side surfaces widthwise: The parts (2d,e) were produced from a rolled Mo plate Mo-1 wt. % ZrO₂, worked and ground on all sides. The wall thickness was 8 mm. By means of contour milling, the parts (2d,e) were provided at the joints to be connected with a profile (5b) and with a recess for a U seam (3a) in a way corresponding to FIG. 9.

The fixing of the parts (2d,e,f) in an form-locking and force-locking manner was performed by caulking (5c), metallurgical bonding by way of a thermally sprayed Mo layer (3a) with the form of a U seam, which was produced by IVPS. The production of the layer (3a) was performed according to Example 1. After the spraying process, the rectangular container (1) was removed from the vacuum chamber and the end faces were worked by means of machining (milling, grinding).

Example 4

Figure 10:
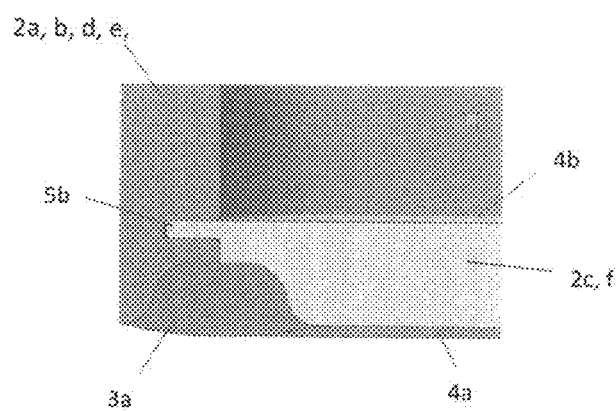
FIG. 10 schematically shows two parts fixed in relation to one another in an form-locking manner by a tongue-and-groove connection and connected in a metallurgically bonding manner by a U seam, and also a sprayed layer for sealing the inside and a sprayed layer for sealing the outside.

For the production of a round container according to FIG. 2, the following parts (see FIG. 1) were used:

Two hollow cylinder segments (2a,b): The hollow cylinder segments (2a,b) were produced from rolled Mo-0.7 wt. % La₂O₃ plates, which were milled on one side to a thickness of 20 mm. The plates are formed into half shells (2a,b). By means of contour milling, the parts (2a,b) were provided at the joints to be connected with a profile (5b) and with a recess for a U seam (3a) in a way corresponding to FIG. 10.

Bottom plate (2c): the bottom plate (2c) was produced from a rolled round W blank with a wall thickness of 20 mm. By means of contour milling, the bottom plate (2c) was provided at the joints to be connected with a profile and with a recess for a U seam (3a) in a way corresponding to FIG. 10.

The parts (2a,b,c) were subsequently fixed in relation to one another in an form-locking manner by way of the tongue-and-groove connection (5b). The metallurgical bonding of the parts (2a,b,c) was performed by way of a thermally sprayed Mo U seam (3a), which was produced by IVPS. The production of the layer (3a) was performed according to Example 1. After the spraying process, the round container (1) was removed from the vacuum chamber and the end faces were worked by means of machining (milling, grinding).

Example 5

Figure 6:
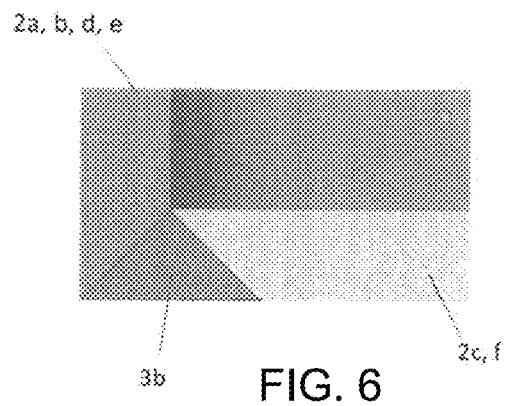
FIG. 6 schematically shows two parts connected in a metallurgically bonded manner by a V seam.

A ring of Inconel 718 with the composition of 0.04 wt. % C; 19 wt. % Cr; 3.0 wt. % Mo; 52.5 wt. % Ni; 0.9 wt. % Al; ≤0.1 wt. % Cu; 5.1 wt. % Nb; 0.9 wt. % Ti and 19 wt. % Fe was connected to a bottom plate (2c) of Mo. The metallurgical bond was achieved by means of a sprayed V seam (3b) (see FIG. 6). Mo was used as the material for the sprayed seam. A round container (1) with an impermeable metallurgical bond could also have been produced with materials of different types (Ni-based superalloy and refractory metal).

Example 6

Figure 7:
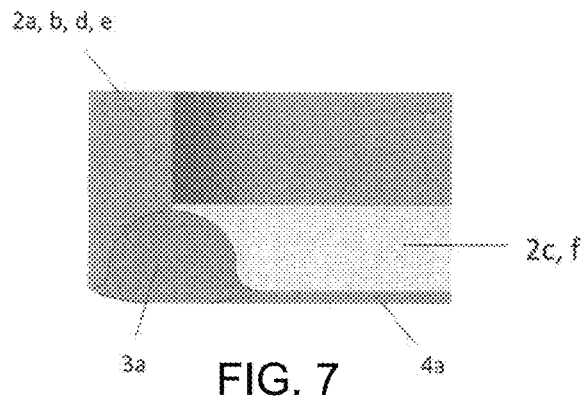
FIG. 7 schematically shows two parts connected in a metallurgically bonded manner by a U seam, and also a sprayed layer for sealing the outside.
Figure 8:
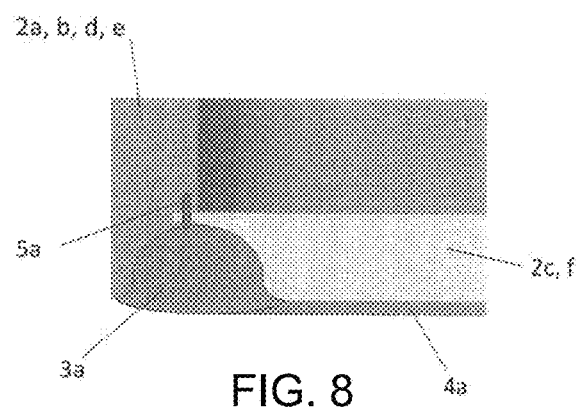
FIG. 8 schematically shows two parts fixed in relation to one another in an form-locking manner by a pin connection and connected in a metallurgically bonded manner by a U seam, and also a sprayed layer for sealing the outside.
Figure 11:
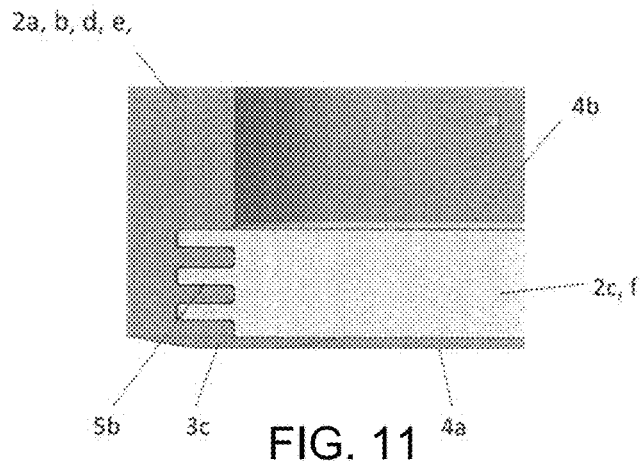
FIG. 11 schematically shows two parts fixed in relation to one another in an form-locking manner by a tongue-and-groove connection, a sprayed layer applied on the outside for the metallurgical bond and for sealing and a sprayed layer applied on the inside for sealing.
Figure 12:
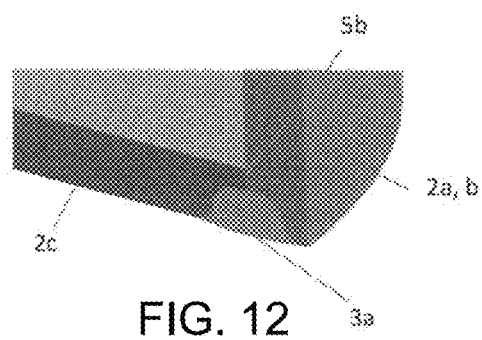
FIG. 12 schematically shows two parts fixed in relation to one another in an form-locking manner by a tongue-and-groove connection and connected in a metallurgically bonding manner by a U seam.

With Mo plates produced from a rolled plate with a thickness of 15 mm, different variants were successfully tested for form-locking fixing and metallurgical bonding. Impermeable layers were also produced. Mo was used in each case as the material for the layers (spraying conditions according to Example 1). The various configurations are represented in the following figures:

FIG. 7: metallurgical bonding by a U seam (3a), applying an impermeable layer (4a) on the outside FIG. 8: form-locking fixing by pinning (5a), metallurgical bonding by a U seam (3a), applying an impermeable layer (4a) on the outside FIG. 11: form-locking fixing by a tongue-and-groove connection (5b), metallurgical bonding by a layer (3c) applied over a surface area, applying an impermeable layer (4a) on the outside and an impermeable layer (4b) on the inside FIG. 12: form-locking fixing by a tongue-and-groove connection (5b), metallurgical bonding by a U seam (3a)

Figure 13:
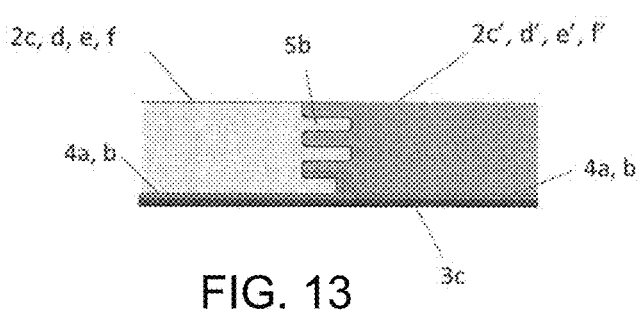
FIG. 13 schematically shows two parts fixed in an form-locking manner by a tongue-and-groove connection and also a sprayed layer for sealing and a sprayed layer for the metallurgical bond.

FIG. 13: form-locking fixing by a tongue-and-groove connection (5b), applying an impermeable layer (4a,b), metallurgical bonding by a Mo sprayed layer (3c) applied over a surface area

The invention claimed is:

1. A container, comprising:
   at least two parts connected to one another;
   at least one of said parts being formed of a refractory metal or a refractory metal alloy with a refractory metal content >80 wt. %; and
   a thermally sprayed layer connecting said at least two parts to one another at least in some regions to form the container.

2. The container according to claim 1, wherein said sprayed layer forms a connection with at least one of said parts, said connection having at least one principle of action selected from the group consisting of metallurgical bonding and form-locking engagement.

3. The container according to claim 1, wherein said sprayed layer is formed as a seam.

4. The container according to claim 3, wherein said seam is U-shaped or V-shaped.

5. The container according to claim 1, wherein said at least two parts at least in some regions are fixed relative to one another or connected to one another by at least one of form-locking, force-locking or metallurgical bonding.

6. The container according to claim 1, wherein said at least two parts are fixed relative to one another or connected to one another by a pin connection, a tongue-and-groove connection or caulking.

7. The container according to claim 1, wherein said refractory metal is molybdenum or tungsten.

8. The container according to claim 1, wherein said sprayed layer is a plasma-sprayed layer.

9. The container according to claim 1, wherein said sprayed layer is formed of a refractory metal.

10. The container according to claim 1, wherein the container is a round container.

11. The container according to claim 10, wherein said at least two parts of the round container include at least two hollow cylinder segments and at least one bottom part.

12. The container according to claim 1, wherein the container is a rectangular container.

13. The container according to claim 12, wherein said at least two parts of the rectangular container include at least two side parts and at least one U-shaped or plate-shaped bottom part.

14. The container according to claim 1, which further comprises a container inside, a container outside, and an impermeable layer disposed on at least one of said container inside or said container outside.

15. The container according to claim 14, wherein at least one of said sprayed layer or said impermeable layer is impermeable to a ceramic melt.

16. A method for producing a container, the method comprising the following steps:
producing at least two parts, at least one of the parts being formed of a refractory metal or a refractory metal alloy with a refractory metal content >80 wt. %;
applying a thermally sprayed layer to the at least two parts at least in some regions; and
using the sprayed layer at least in some regions to connect the at least two parts in a metallurgically bonded or form-locking manner to form the container.

17. The method according to claim 16, which further comprises carrying out the step of producing the at least two parts by using at least one production step selected from the group consisting of powder pressing, sintering, hot isostatic pressing and forming.

18. The method according to claim 16, which further comprises machining the parts to permit the parts to be fixed relative to one another or connected to one another by at least one of form-locking, force-locking or metallurgically bonding at least in some regions.

19. The method according to claim 16, which further comprises machining the parts to permit the parts to be connected by a thermally sprayed seam of the sprayed layer.

20. The method according to claim 16, which further comprises carrying out the step of applying the thermally sprayed layer to connect the parts by using a thermal spraying method selected from the group consisting of plasma spraying, electric-arc spraying, flame spraying, detonation spraying, cold-gas spraying and laser spraying.

21. The method according to claim 16, which further comprises carrying out the step of connecting the parts by vacuum plasma spraying.

22. The method according to claim 16, which further comprises sealing the container by action of a slurry.

23. The method according to claim 22, which further comprises annealing the container after the sealing step.

24. A method for melting aluminum oxide, the method comprising the following steps:
producing a container by:
producing at least two parts, at least one of the parts being formed of a refractory metal or a refractory metal alloy with a refractory metal content >80 wt. %,
applying a thermally sprayed layer to the at least two parts at least in some regions, and
using the sprayed layer at least in some regions to connect the at least two parts in a metallurgically bonded or form-locking manner to form the container; and
using the container to melt aluminum oxide.

* * * * *